US011121007B2

United States Patent
Kim et al.

(10) Patent No.: US 11,121,007 B2
(45) Date of Patent: Sep. 14, 2021

(54) APPARATUS FOR SUPPLYING CHEMICAL LIQUID

(71) Applicant: Semes Co., Ltd., Cheonan-si (KR)

(72) Inventors: Jae-Youl Kim, Yongin-si (KR); Jeeyong Jung, Cheonan-si (KR); Young Ho Seo, Cheonan-si (KR); Dae Sung Kim, Cheonan-si (KR); Beomjeong Oh, Cheonan-si (KR); Kwangbok Jun, Cheonan-si (KR); Hyungoo Kwon, Anseong-si (KR); Sanguk Son, Suwon-si (KR)

(73) Assignee: SEMES CO., Ltd.

( * ) Notice: Subject to any disclaimer, the term of this patent is extended or adjusted under 35 U.S.C. 154(b) by 111 days.

(21) Appl. No.: 16/532,986

(22) Filed: Aug. 6, 2019

(65) Prior Publication Data

US 2020/0105546 A1 Apr. 2, 2020

(30) Foreign Application Priority Data

Sep. 27, 2018 (KR) .................. 10-2018-0114607

(51) Int. Cl.
| | |
|---|---|
| *H01L 21/67* | (2006.01) |
| *B05C 5/02* | (2006.01) |
| *B05C 11/10* | (2006.01) |

(52) U.S. Cl.
CPC .......... *H01L 21/67023* (2013.01); *B05C 5/02* (2013.01); *B05C 11/10* (2013.01); *H01L 21/6715* (2013.01)

(58) Field of Classification Search
CPC . H01L 21/67023; H01L 21/6715; B05C 5/02; B05C 11/10

USPC ............................................. 222/189.06
See application file for complete search history.

(56) References Cited

U.S. PATENT DOCUMENTS

| | | | | |
|---|---|---|---|---|
| 4,923,096 A | * | 5/1990 | Ennis, III ............ | B05C 17/0123 222/108 |
| 5,002,008 A | * | 3/1991 | Ushijima ................ | B05C 11/08 118/313 |
| 5,806,716 A | * | 9/1998 | Vogt ......................... | B67D 7/16 222/59 |
| 5,853,812 A | * | 12/1998 | Kawasaki ............... | B05B 15/52 427/424 |

(Continued)

FOREIGN PATENT DOCUMENTS

| | | |
|---|---|---|
| JP | 2002-200453 A | 7/2002 |
| JP | 2009-285845 A | 12/2009 |

(Continued)

*Primary Examiner* — Paul R Durand
*Assistant Examiner* — Michael J. Melaragno
(74) *Attorney, Agent, or Firm* — Daly, Crowley, Mofford & Durkee, LLP

(57) ABSTRACT

An apparatus for supplying chemical liquid may include a chemical liquid discharging member, a reservoir, a chemical liquid supplying member and a chemical liquid circulating member. The chemical liquid discharging member may discharge a chemical liquid onto a substrate. The reservoir may store the chemical liquid supplied to the chemical liquid discharging member. The chemical liquid supplying member may supply the chemical liquid stored in the reservoir. The chemical liquid circulating member may circulate the chemical liquid from the chemical liquid discharging member to the reservoir.

20 Claims, 2 Drawing Sheets

(56) References Cited

U.S. PATENT DOCUMENTS

| | | | | |
|---|---|---|---|---|
| 5,968,268 A * | 10/1999 | Kitano | | H01L 21/6715 118/52 |
| 6,248,168 B1 * | 6/2001 | Takeshita | | B05D 1/005 118/52 |
| 6,562,217 B1 * | 5/2003 | Tanaka | | C23C 18/31 205/143 |
| 2001/0026839 A1 * | 10/2001 | Akimoto | | H01L 21/3105 427/243 |
| 2002/0020627 A1 * | 2/2002 | Kunisawa | | H01L 21/6715 205/96 |
| 2002/0078890 A1 * | 6/2002 | Tsujii | | C03C 17/001 118/708 |
| 2002/0124798 A1 * | 9/2002 | Kitano | | G03F 7/162 118/300 |
| 2002/0163560 A1 * | 11/2002 | Ohsawa | | B41C 1/1066 347/55 |
| 2002/0176928 A1 * | 11/2002 | Minami | | H01L 21/67253 427/8 |
| 2003/0113440 A1 * | 6/2003 | Hayashi | | H01L 21/6715 427/8 |
| 2003/0180471 A1 * | 9/2003 | Takekuma | | H01L 21/67253 430/271.1 |
| 2005/0167404 A1 * | 8/2005 | Yamazaki | | H01L 21/6715 219/121.43 |
| 2006/0040051 A1 * | 2/2006 | Yamamoto | | H01L 21/6715 427/240 |
| 2006/0139406 A1 * | 6/2006 | Tsuchiya | | B05D 1/26 347/54 |
| 2016/0086810 A1 * | 3/2016 | Fujiwara | | H01L 21/6704 438/748 |
| 2019/0060789 A1 * | 2/2019 | Nishimura | | F04B 43/02 |
| 2020/0254777 A1 * | 8/2020 | Zhang | | B41J 2/17566 |

FOREIGN PATENT DOCUMENTS

| | | |
|---|---|---|
| JP | 2012-096524 A | 5/2012 |
| KR | 10-0765391 B1 | 10/2007 |
| KR | 2013-0105774 A | 9/2013 |
| KR | 10-1397446 B1 | 5/2014 |
| KR | 2015-0055561 A | 5/2015 |
| KR | 10-1687179 B1 | 12/2016 |
| KR | 10-1854963 B1 | 5/2018 |
| KR | 10-1856285 B1 | 5/2018 |

* cited by examiner

APPARATUS FOR SUPPLYING CHEMICAL LIQUID

CROSS-REFERENCE TO RELATED APPLICATION

This application claims a priority to Korean Patent Application No. 10-2018-0114607 filed on Sep. 27, 2018 in the Korean Intellectual Property Office (KIPO), the content of which is herein incorporated by reference in their entity.

BACKGROUND

1. Field

Example embodiments of the invention relate to an apparatus for supplying chemical liquid. More particularly, example embodiments of the invention relate to an apparatus for supplying chemical liquid including a chemical liquid discharging member capable of discharging a chemical liquid onto a substrate and a reservoir capable of storing the chemical liquid.

2. Related Technology

The conventional chemical liquid supplying apparatus can be used in processes for manufacturing a display device such as a liquid crystal display device, an organic light emitting display device, etc. The conventional chemical liquid supplying apparatus generally includes a chemical liquid discharging member such as an ink jet head having a plurality of nozzles for discharging chemical liquid onto a substrate and a reservoir for storing the chemical liquid supplied to the chemical liquid discharging member.

In the conventional chemical liquid supplying apparatus, the chemical liquid supplied from the reservoir to the chemical liquid discharging member flows one portion of the reservoir to another portion of the reservoir. In this case, the chemical liquid can be congested in the reservoir or the chemical liquid can be blocked in a chemical liquid supplying line for connecting the reservoir to the chemical liquid discharging member. Therefore, bubbles can be generated in the chemical liquid in the reservoir and also the bubbles included in the chemical liquid can be grown when the chemical liquid passes through the chemical liquid supplying line. If the chemical liquid including such bubbles is provided to the chemical liquid discharging member, the chemical liquid cannot be discharged onto the substrate from the chemical liquid discharging member, or the chemical liquid can be insufficiently discharged onto the substrate from the chemical liquid discharging member.

The chemical liquid discharging member is frequently maintained so as to prevent the chemical liquid from being not discharged or insufficiently discharged onto the substrate because of the generation and growth of the bubbles, and thus the cost and time for maintaining chemical liquid discharging member can increase. If the chemical liquid includes an organic solvent containing a pigment, the pigment can precipitate in the organic solvent of the chemical liquid, and thus the chemical liquid cannot have desired characteristics.

SUMMARY

It is one object of the invention to provide an apparatus for supplying chemical liquid capable of preventing the congestion or blocking of chemical liquid in the apparatus for supplying chemical liquid.

It is another object of the invention to provide an apparatus for supplying chemical liquid capable of effectively removing bubbles which can be generated in chemical liquid in the apparatus for supplying chemical liquid.

According to one aspect of the invention, there is provided an apparatus for supplying chemical liquid, which may include a chemical liquid discharging member, a reservoir, a chemical liquid supplying member and a chemical liquid circulating member. The chemical liquid discharging member may discharge a chemical liquid onto a substrate, and the reservoir may store the chemical liquid supplied to the chemical liquid discharging member. The chemical liquid supplying member may supply the chemical liquid stored in the reservoir, and the chemical liquid circulating member may circulate the chemical liquid from the chemical liquid discharging member to the reservoir.

In example embodiments, the chemical liquid supplying member may include a supplying line capable of connecting the reservoir to the chemical liquid discharging member and a supplying pump capable of pumping the chemical liquid from the reservoir to the chemical liquid discharging member. Additionally, the chemical liquid circulating member may include a circulating line capable of connecting the chemical liquid discharging member to the reservoir and a circulating pump capable of pumping the chemical liquid from the chemical liquid discharging member to the reservoir.

In example embodiments, the chemical liquid supplying member may be connected to a first portion of the reservoir and the chemical liquid circulating member may be connected to a second portion of the reservoir.

In example embodiments, the apparatus for supplying chemical liquid may additionally include a bubble removing member disposed in the reservoir to remove bubbles which can be generated in the chemical liquid.

In example embodiments, the bubble removing member may include at least one plate having a plurality of holes and the at least one plate divides a space of the reservoir into a plurality of sections in a direction substantially perpendicular to a direction in which the chemical liquid flows in the reservoir. Here, the at least one plate may include a hydrophobic material. Additionally, each of the holes may have a diameter of about 300 µm to about 500 µm.

In example embodiments, the apparatus for supplying chemical liquid may additionally include a negative pressure providing member capable of providing a negative pressure to the chemical liquid discharging member to maintain a meniscus of the chemical liquid discharging member.

In example embodiments, the apparatus for supplying chemical liquid may additionally include a negative pressure controlling member capable of adjusting the negative pressure provided to the chemical liquid discharging member to substantially constantly maintain the meniscus of the chemical liquid discharging member.

In example embodiments, the negative pressure controlling member may include a sensing member capable of sensing conditions of the chemical liquid and a controlling member capable of controlling the negative pressure providing member on the basis of the conditions of the chemical liquid sensed by the sensing member.

In some example embodiments, the negative pressure controlling member may include a sensing member capable of sensing conditions of the chemical liquid and a controlling member capable of controlling the supplying pump of the chemical liquid supplying member and the circulating pump of the chemical liquid circulating member on the basis of the conditions of the chemical liquid sensed by the sensing member.

In example embodiments, the sensing member may include a first pressure sensor capable of sensing a first pressure of the chemical liquid flowing in the supplying line, a second pressure sensor capable of sensing a second pressure of the chemical liquid flowing in the circulating line, and a flow sensor capable of sensing a flow rate of the chemical liquid flowing in the circulating line. Further, the controlling member may be capable of controlling the negative pressure providing member or the supplying pump and the circulating pump on the basis of the first pressure, the second pressure and flow rate transmitted from the sensing member.

In example embodiments, the apparatus for supplying chemical liquid may additionally include a damping member capable of absorbing a vibration which can be generated in the reservoir by a flow of the chemical liquid in the reservoir.

In example embodiments, the apparatus for supplying chemical liquid may additionally include a buffer reservoir for temporarily storing the chemical liquid supplied to the reservoir.

According to another aspect of the invention, there is provided an apparatus for supplying chemical liquid, which may include a chemical liquid discharging member, a reservoir, a buffer reservoir and a bubble removing member. The chemical liquid discharging member may discharge a chemical liquid onto a substrate, and the reservoir may store the chemical liquid supplied to the chemical liquid discharging member. The buffer reservoir may temporarily store the chemical liquid supplied to the reservoir, and the bubble removing member may be disposed in the reservoir to remove bubbles which can be generated in the chemical liquid flows to a second portion of the reservoir from a first portion of the reservoir. Here, the chemical liquid discharging member may be connected to the first portion of the reservoir and the buffer reservoir may be connected to the second portion of the reservoir In example embodiments, the bubble removing member may include at least one plate having a plurality of holes and the at least one plate divides a space of the reservoir into a plurality of sections in a direction substantially perpendicular to a direction in which the chemical liquid flows in the reservoir. Here, the at least one plate may include a hydrophobic material. Additionally, each of the holes may have a diameter of about 300 μm to about 500 μm.

According to example embodiments of the invention, the chemical liquid may be continuously circulated by the chemical liquid circulating member such that the chemical liquid may not be congested or blocked in the reservoir, the supplying line and/or the circulating line. Therefore, bubbles may not be generated in the chemical liquid stored in the reservoir, and the pigment contained in the organic solvent may not be precipitated in the chemical liquid stored in the reservoir. Further, the bubbles generated in the chemical liquid stored in the reservoir may be effectively removed by the bubble removing member. Therefore, the bubble removing member may prevent that the chemical liquid is not discharged from the chemical liquid discharging member onto the substrate, or the chemical liquid is insufficiently provided onto the substrate. Moreover, the time and cost for removing the bubbles generated in the chemical liquid may be efficiently reduced.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
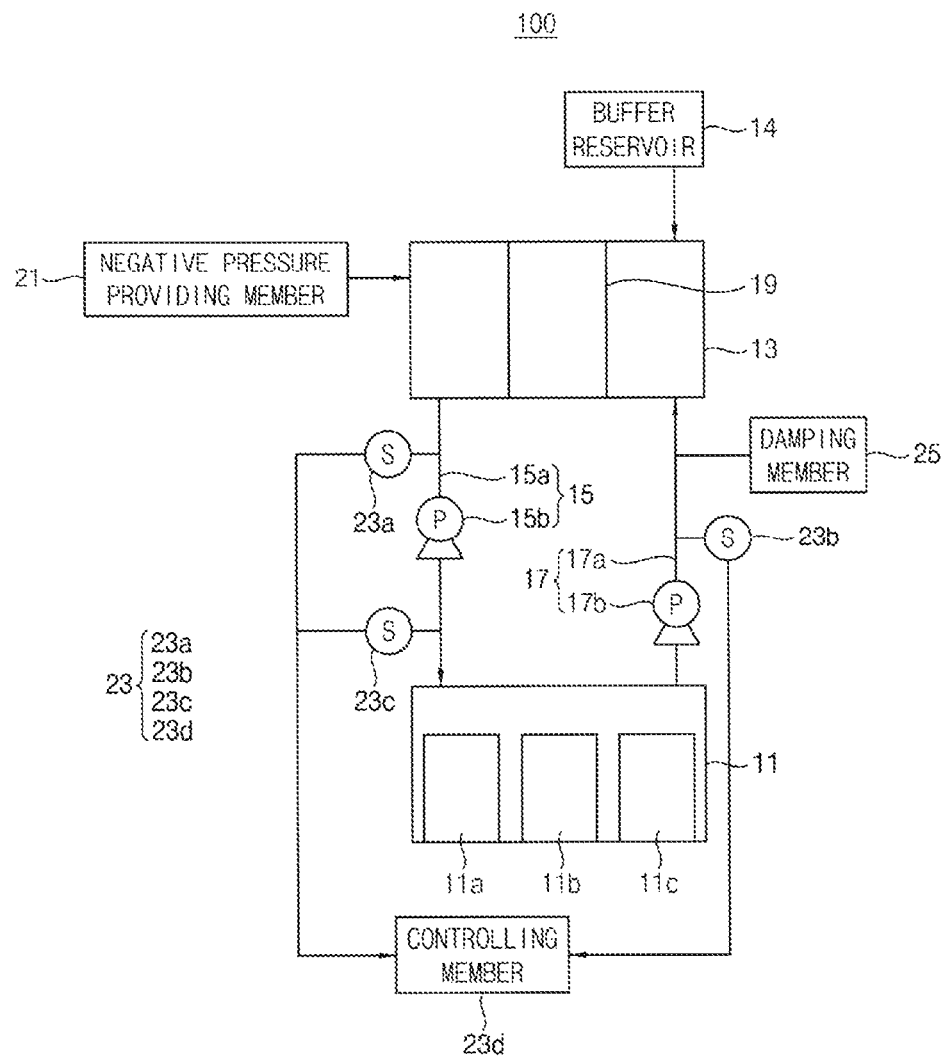
FIG. 1 is a schematic flow diagram illustrating an apparatus for supplying chemical liquid in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises"

and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an apparatus for supplying chemical liquid according to example embodiments of the invention will be described in detail with reference to the accompanying drawings. In the drawings, like or similar elements may be indicated by like or similar reference numerals.

Figure 2:
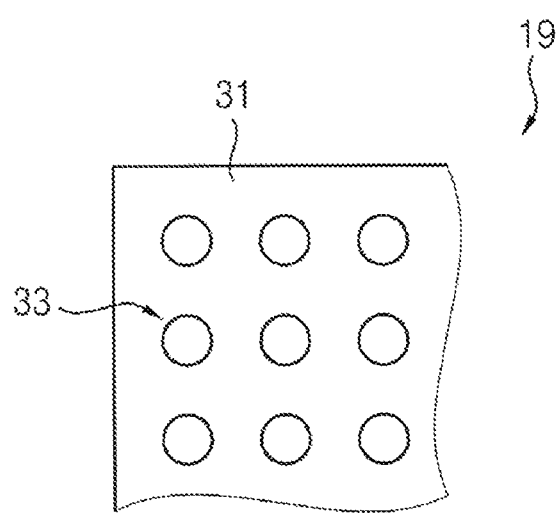
FIG. 2 is a schematic plan view illustrating a bubble removing member of an apparatus for supplying chemical liquid in accordance with example embodiments of the invention.

FIG. 1 is a schematic flow diagram illustrating an apparatus for supplying chemical liquid in accordance with example embodiments of the invention. FIG. 2 is a schematic plan view illustrating a bubble removing member of the apparatus for supplying chemical liquid in accordance with some example embodiments of the invention.

Referring to FIG. 1, an apparatus for supplying chemical liquid 100 may be used to discharge a chemical liquid onto a substrate in processes for manufacturing display devices, for example, liquid crystal display devices, organic light emitting display devices, etc. For example, the apparatus for supplying chemical liquid 100 may provide the substrate with a predetermined chemical liquid in processes for forming a color filter, an orientation layer, or an organic light emitting layer on the substrate. The chemical liquid may include an organic solvent containing a proper pigment according to the layer to be formed on the substrate. Here, the pigment may be precipitated in the organic solvent of the chemical liquid.

As illustrated in FIG. 1, the apparatus for supplying chemical liquid 100 may include a chemical liquid discharging member 11, a reservoir 13, a chemical liquid supplying member 15, and a chemical liquid circulating member 17.

The chemical liquid discharging member 11 may provide the predetermined chemical liquid onto the substrate. In example embodiments, the chemical liquid discharging member 11 may include a plurality of ink jet heads 11a, 11b and 11c which can discharge the chemical liquid onto the substrate by an ink jet method. For example, the chemical liquid discharging member 11 may generally include a unit of three ink jet heads 11a, 11b and 11c. Further, each of the ink jet heads 11a, 11b and 11c may include a plurality of nozzles which can spray the chemical liquid onto the substrate by the ink jet method.

In example embodiments, each of the ink jet heads 11a, 11b and 11c of the chemical liquid discharging member 11 may include about 128 or about 256 nozzles. The nozzles may be arranged in a line by a predetermined distance, and each of the nozzles may provide the substrate with the chemical liquid by the amount of µg. Further, each of the ink jet heads 11a, 11b and 11c of the chemical liquid discharging member 11 may include a plurality of piezoelectric elements so that the number of the piezoelectric elements may substantially correspond to the number of the nozzles. Here, the chemical liquid may be discharged onto the substrate through the nozzles by the operations of the piezoelectric elements. Moreover, the amounts of the chemical liquid discharged from the nozzles may be independently adjusted by controlling voltages applied to the piezoelectric elements.

The reservoir 13 may store the chemical liquid and may provide the chemical liquid discharging member 11 with the stored chemical liquid. The reservoir 13 may have a predetermined space for storing the chemical liquid therein.

Referring now to FIG. 1, the chemical liquid supplying member 15 may supply the chemical liquid from the reservoir 13 to the chemical liquid discharging member 11. In example embodiments, the chemical liquid supplying member 15 may include a supplying line 15a and a supplying pump 15b. The supplying line 15a may connect the reservoir 13 to the chemical liquid discharging member 11 such that the chemical liquid may be provided from the reservoir 13 to the chemical liquid discharging member 11. The supplying pump 15a may pump the chemical liquid from the reservoir 13 to the chemical liquid discharging member 11. Further, the supplying pump 15b may control the amount of chemical liquid provided from the reservoir 13 to the chemical liquid discharging member 11.

The chemical liquid circulating member 17 may circulate the chemical liquid from the chemical liquid discharging 11 into the reservoir 13. In example embodiments, the chemical liquid circulating member 17 may enable the chemical liquid to flow from the chemical liquid discharging member 11 into the reservoir 13 after the chemical liquid flows from the reservoir 13 to the chemical liquid discharging member 11. That is, the chemical liquid may be circulated between the chemical liquid discharging member 11 and the reservoir 13 by the chemical liquid circulating member 17. In this case, the chemical liquid circulating member 17 may directly circulate the chemical liquid from the chemical liquid discharging member 11 to the reservoir 13 without any components. In other words, the chemical liquid circulating member 17 may directly connect the chemical liquid discharging member 11 to the reservoir 13.

According to example embodiments, the chemical liquid circulating member 17 may include a circulating line 17a and a circulating pump 17b. The circulating line 17a may connect the chemical liquid discharging member 11 to the reservoir 13 such that the chemical liquid may flow from the chemical liquid discharging member 11 into the reservoir 13. The circulating pump 17b may pump the chemical liquid from the chemical liquid discharging member 11 to the reservoir 13. Further, the circulating pump 17b may adjust the amount of chemical liquid circulated between the chemical liquid discharging member 11 and the reservoir 13. For example, the circulating pump 17b may be connected to the circulating line 17a in series.

In example embodiments, the chemical liquid may flow out from a first portion of the reservoir 13 when the chemical liquid supplying member 15 provides the chemical liquid from the reservoir 13 to the chemical liquid discharging member 11. Additionally, the chemical liquid may flow into a second portion of the reservoir 13 when the chemical liquid circulating member 17 circulate the chemical liquid from the chemical liquid discharging member 11 into the reservoir 13. The chemical liquid may flow from the second portion to the first portion in the reservoir 13. Therefore, the chemical liquid supplying member 15 may be connected to the first portion of the reservoir 13 while the chemical liquid circulating member 17 may be connected to the second portion of the reservoir 13.

As described above, the chemical liquid supplying member 15 may connect the reservoir 13 to the chemical liquid discharging member 11 and the chemical liquid circulating member 17 may connect the chemical liquid discharging member 11 to the reservoir 13. Therefore, the chemical liquid may not be congested or blocked in the reservoir 13, the supply line 15a and/or the circulating line 17a by the chemical liquid supplying member 15 and the chemical liquid circulating member 17. As a result, bubbles may not be generated in the chemical liquid stored in the reservoir 13, and also the pigment contained in the organic solvent may not be precipitated in the chemical liquid stored in the reservoir 13.

As illustrated in FIG. 2, the apparatus for supplying chemical liquid 100 may additionally include a bubble removing member 19.

Referring to FIGS. 1 and 2, the bubble removing member 19 of the apparatus for supplying chemical liquid 100 may locate in the reservoir 13 and may substantially remove bubbles generated in the chemical liquid circulated between the reservoir 13 and the chemical liquid discharging member 11. That is, the bubble removing member 19 may substantially remove the bubbles generated in the chemical liquid while the chemical liquid circulates between the reservoir 13 and the chemical liquid discharging member 11 by the chemical liquid supplying member 15 and the chemical liquid circulating member 17. Further, the bubble removing member 19 may additionally remove impurities, for example particles contained in the chemical liquid circulated between the reservoir 13 and the chemical liquid discharging member 11.

The bubble removing member 19 may divide the space in the reservoir 13 into a plurality of sections. For example, the bubble removing member 19 may divide the space of the reservoir 13 into three sections. Here, the bubble removing member 19 may include at least two plates. The bubble removing member 19 may divide the space of the reservoir 13 in a direction substantially perpendicular to a direction in which the chemical liquid flows in the reservoir 13. For example, the bubble removing member 19 may include more than one plates disposed in a direction substantially perpendicular to the direction in which the chemical liquid flows from the second portion of the reservoir 13 to the first portion of the reservoir 13.

As described above, the bubble removing member 19 may divide the space of the reservoir 13 into the plurality of sections such that the chemical liquid may not be turbulent in the reservoir 13, or the chemical liquid may not be rotated or fluctuated in the reservoir 13 when the chemical liquid is provided to the chemical liquid discharging member 11 and/or the chemical liquid is circulated from the chemical liquid discharging member 11. Therefore, the generation of the bubbles in the chemical liquid flowing in the reservoir 13 may be minimized or prevented.

As illustrated in FIG. 2, the bubble removing member 19 may remove the bubbles generated in the chemical liquid while the bubble removing member 19 may not block or delay the flow of the chemical liquid in the reservoir 13. In example embodiments, a plurality of holes 33 may be provided the bubble removing member 19 may be provided in the at least one plate of the bubble removing member 19. For example, each of the holes 33 of the plate of the bubble removing member 19 may have a diameter between about 300 μm and about 700 μm. Preferably, each of the holes 33 may have a diameter between about 500 μm. However, the diameters of the holes 33 may vary depending on the dimensions of the chemical liquid discharging member 11, the types of the chemical liquid, etc. In other words, bubbles having sizes substantially larger or smaller than a predetermined size defined by adjusting the diameter of each hole 33 of the bubble removing member 19. Meanwhile, although the bubbles having sizes substantially smaller than the predetermined size may pass though the holes 33 of the bubble removing member 19, such relatively small bubbles may grow to bubbles having sizes substantially larger than the predetermined size while the chemical liquid continuously circulates through the reservoir 13, the chemical liquid supplying member 15, the chemical liquid discharging member 11 and the chemical liquid circulating member 17. Such grown bubbles may be effectively removed by the bubble removing member 19 in the reservoir 13.

In some example embodiments, a surface 31 of the at least one plate of the bubble removing member 19 may include a hydrophobic material. For example, a hydrophobic material may be coated on the surface 31 of the at least one plate. When the surface 31 of the at least one plate includes the hydrophobic material, the chemical liquid may not adhere to the surface 31 of the plate or to insides of the holes 33 of the plate when the chemical liquid is provided to the chemical liquid discharging member 11 and/or the chemical liquid is circulated from the chemical liquid discharging member 11. Therefore, the chemical liquid may smoothly flow in the reservoir 13. Further, the hydrophobic material may be coated on the insides of the holes 33 of the at least one plate of the bubble removing member 19.

According to the apparatus for supplying chemical liquid 100 illustrated in FIGS. 1 and 2, the bubbles generated in the chemical liquid stored in the reservoir 13 may be effectively removed by the bubble removing member 19 including the at least one plate. As a result, the bubble removing member 19 may prevent that the chemical liquid is not discharged from the chemical liquid discharging member 11 onto the substrate, or the chemical liquid is insufficiently provided onto the substrate. Further, the time and cost for removing the bubbles generated in the chemical liquid may be efficiently reduced. Although the bubble removing member 19 of the apparatus for supplying chemical liquid 100 includes two plates disposed in the reservoir 13, the number of the plates of the bubble removing member 19 may increase or decrease depending on the dimensions of the apparatus for supplying chemical liquid 100, the types of the chemical liquid, etc.

Referring now to FIG. 1, the apparatus for supplying chemical liquid 100 may additionally include a negative pressure providing member 21.

The negative pressure providing member 21 may provide a negative pressure to the chemical liquid discharging member 11 so as to maintain a meniscus of the chemical liquid discharging member 11 while supplying the chemical liquid onto the substrate from the chemical liquid discharging member 11. Additionally, the negative pressure providing member 21 may provide the negative pressure to the chemical liquid discharging member 11 in order to maintain the meniscus of the chemical liquid discharging member 11 when the chemical liquid is not provided onto the substrate from the chemical liquid discharging member 11. Furthermore, the negative pressure providing member 21 may provide the negative pressure to the chemical liquid discharging member 11 in order to maintain the meniscus of the chemical liquid discharging member 11 while circulating the chemical liquid from the chemical liquid discharging member 11 into the reservoir 13. As such, the negative pressure providing member 21 may provide the negative pressure to the chemical liquid discharging member 11 such that desired meniscus may be maintained at the end portions of the nozzles of the ink jet heads 11a, 11b and 11c of the chemical liquid discharging member 11.

In some example embodiments, the apparatus for supplying chemical liquid 100 may include a positive pressure providing member (not illustrated). In this case, the negative pressure providing member 21 may provide the negative pressure to the chemical liquid discharging member 11 to maintain the meniscus of the chemical liquid discharging member 11 when the chemical liquid is not supplied onto the substrate, and also the positive pressure providing member may provide a positive pressure to the chemical liquid discharging member 11 in order to properly maintain the meniscus of the chemical liquid discharging member 11 when the chemical liquid is provided onto the substrate.

In the apparatus for supplying chemical liquid 100, the negative pressure providing member 21 may be connected to the reservoir 13 in a parallel configuration. The negative pressure providing member 21 may include an inlet portion and an outlet portion. Here, each of the inlet and the outlet portions of the negative pressure providing member 21 may include a valve assembly which can be adjusted by an on-off control. In some example embodiments, the outlet portion of the negative pressure providing member 21 may include a valve assembly which can be adjusted by the on-off control and the inlet portion of the negative pressure providing member 21 may include a valve assembly which can be adjusted by a proportional control. As such, the meniscus of the chemical liquid discharging member 11 may be more precisely maintained by the negative pressure providing member 21 including the inlet portion and the outlet portion each of which may have such valve assembly.

In other example embodiments, the negative pressure providing member 21 may include a pump controller having a dual structure. With such a negative pressure providing member 21, the meniscus of the chemical liquid discharging member 11 may be precisely controlled even though the amount of the chemical liquid supplied to the chemical liquid discharging member 11 varies.

As described above, the apparatus for supplying chemical liquid 100 may include the negative pressure providing member 21 having a variety of configurations so that the meniscus of the chemical liquid discharging member 11 may be desirably maintained when the chemical liquid is supplied to the chemical liquid discharging member 11 and when the chemical liquid is not provided to the chemical liquid discharging member 11.

In example embodiments, the apparatus for supplying chemical liquid 100 may additionally include a negative pressure controlling member 23. The negative pressure controlling member 23 may adjust the negative pressure applied to the chemical liquid discharging member 11 so as to more stably constantly maintain the meniscus of the chemical liquid discharging member 11 during the supply of the chemical liquid and the circulation of the chemical liquid. For example, the negative pressure controlling member 23 may directly control the negative pressure providing member 21 to more stably maintain the meniscus of the chemical liquid discharging member 11. Alternatively, the negative pressure controlling member 23 may control the supplying pump 15b of the chemical liquid supplying member 15 and the circulating pump 17b of the chemical liquid circulating member 17 in order to more stably constantly maintain the meniscus of the chemical liquid discharging member 11.

According to example embodiments, the negative pressure controlling member 23 may include a sensing member (not illustrated) and a controlling member 23d. The sensing member may sense various conditions of the chemical liquid and the controlling member 23d may control the negative pressure providing member 21 on the basis of the conditions of the chemical liquid sensed by the sensing member. Particularly, the sensing member may include a first pressure sensor 23a, a second pressure sensor 23b and a flow sensor 23c. Here, the first pressure sensor 23a may sense a first pressure of the chemical liquid flowing in the supplying line 15a of the chemical liquid supplying member 15, and the second pressure sensor 23b may sense a second pressure of the chemical liquid flowing in the circulating line 17a of the chemical liquid circulating member 17. In addition, the flow sensor 23c may sense a flow rate of the chemical liquid flowing in the circulating line 17a. The controlling member 23d may control the negative pressure providing member 21 on the basis of the first pressure of the chemical liquid, the second pressure of the chemical liquid and the flow rate of the chemical liquid transmitted from the sensing member.

According to example embodiments, the negative pressure controlling member 23 may control the negative pressure providing member 21 if the negative pressure is different from a previously set value on the basis of a value indicative of the difference between the first pressure of the chemical liquid and the second pressure of the chemical liquid and a value indicative of the variation of the flow rate of the chemical liquid. Therefore, the meniscus of the chemical liquid discharging member 11 may be more precisely adjusted by the negative pressure controlling member 23 even though the meniscus of the chemical liquid discharging member 11 is maintained by the negative pressure providing member 21.

In some example embodiments, the control member 23d of the negative pressure controlling member 23 may control the supplying pump 15b of the chemical liquid supplying member 15 and the circulating pump 17b of the chemical liquid circulating member 17b. Therefore, when the negative pressure is different from the previously set value on the basis of the value indicative of the difference between the first pressure of the chemical liquid and the second pressure of the chemical liquid and the value indicative of the variation of the flow rate of the chemical liquid, the control member 23d may advantageously control the supplying pump 15b and the circulating pump 17b.

In some example embodiments, the apparatus for supplying chemical liquid 100 may include a level sensor capable of sensing a level of the chemical liquid stored in the reservoir 13, a temperature sensor capable of sensing a temperature of the chemical liquid stored in the reservoir 13, etc. In other example embodiments, the apparatus for supplying chemical liquid 100 may include a heating member capable of heating the chemical liquid in the reservoir 13 so as to constantly maintain the temperature of the chemical liquid circulated therein.

In the apparatus for supplying chemical liquid 100, a vibration may be generated in the reservoir 13 by the chemical liquid circulating through the chemical liquid discharging member 11, the chemical liquid supplying member 15, the chemical liquid circulating member 17 and the reservoir 13. Therefore, the apparatus for supplying chemical liquid 100 may additionally include a damping member 25 capable of absorbing the vibration which can be generated in the reservoir 13 by the circulation of the chemical liquid.

In example embodiments, the reservoir 13, the chemical liquid discharging member 11, the circulating line 17a, the circulating pump 17b and the damping member 25 may be disposed in a substantial serial configuration. For example, the reservoir 13, the chemical liquid discharging member 11, the circulating line 17a, the circulating pump 17b and the damping member 25 may be arranged in a single loop circulation structure.

In some example embodiments, the apparatus for supplying chemical liquid 100 may include a buffer reservoir 14 capable of temporarily storing the chemical liquid supplied to the reservoir 13. The meniscus of the chemical liquid discharging member 11 may be broken if the chemical liquid is directly supplied to the reservoir 13 from a canister for receiving the chemical liquid without the buffer reservoir 14. For example, the chemical liquid may be supplied to the reservoir 13 from the canister using a nitrogen gas and a pressure of the nitrogen gas carrying the chemical liquid may be applied to the reservoir 13 to thereby break the meniscus of the chemical liquid discharging member 11. Considering such a problem, the apparatus for supplying chemical liquid 100 may include the buffer reservoir 14 which may be disposed upstream the reservoir 13.

According to some example embodiments, when the chemical liquid discharging member 11 may be connected to a first portion of the reservoir 13, the buffer reservoir 14 may be connected to a second portion of the reservoir 13. The chemical liquid provided from the buffer reservoir 14 to the reservoir 13 may flow from the second portion of the reservoir 13 to the first portion of the reservoir 13. In this case, the bubble removing member 19 may effectively remove bubbles which can be generated in the chemical liquid flowing in the reservoir 13. Further, the bubble removing member 19 may remove impurities contained in the chemical liquid such as particles.

The apparatus for supplying chemical liquid according to example embodiments may be advantageously used in processes for manufacturing a display device such as a liquid crystal display device, an organic light emitting display device, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An apparatus for supplying chemical liquid comprising:
a chemical liquid discharging member for discharging a chemical liquid onto a substrate, the chemical liquid discharging member including a plurality of ink jet heads;
a reservoir for storing the chemical liquid being supplied to the chemical liquid discharging member;
a chemical liquid supplying member for supplying the chemical liquid stored in the reservoir;
a chemical liquid circulating member for circulating the chemical liquid from the plurality of ink jet heads to the reservoir.

2. The apparatus for supplying chemical liquid of claim 1, wherein the chemical liquid supplying member includes a supplying line for connecting the reservoir to the chemical liquid discharging member and a supplying pump for pumping the chemical liquid from the reservoir to the chemical liquid discharging member, and wherein the chemical liquid circulating member includes a circulating line for connecting the chemical liquid discharging member to the reservoir and a circulating pump for pumping the chemical liquid from the chemical liquid discharging member to the reservoir.

3. The apparatus for supplying chemical liquid of claim 1, wherein the chemical liquid supplying member is connected to a first portion of the reservoir and the chemical liquid circulating member is connected to a second portion of the reservoir.

4. The apparatus for supplying chemical liquid of claim 1, further comprising a bubble removing member disposed in the reservoir to remove bubbles which can be generated in the chemical liquid.

5. The apparatus for supplying chemical liquid of claim 4, wherein the bubble removing member includes at least one plate having a plurality of holes and the at least one plate divides a space of the reservoir into a plurality of sections in a direction perpendicular to a direction in which the chemical liquid flows in the reservoir.

6. The apparatus for supplying chemical liquid of claim 5, wherein the at least one plate includes a hydrophobic material.

7. The apparatus for supplying chemical liquid of claim 5, wherein each of the holes has a diameter of about 300 µm to about 500 µm.

8. The apparatus for supplying chemical liquid of claim 1, further comprising a negative pressure providing member for providing a negative pressure to the chemical liquid discharging member to maintain a meniscus of the chemical liquid discharging member.

9. The apparatus for supplying chemical liquid of claim 8, further comprising a negative pressure controlling member for adjusting the negative pressure provided to the chemical liquid discharging member to constantly maintain the meniscus of the chemical liquid discharging member.

10. The apparatus for supplying chemical liquid of claim 9, wherein the negative pressure controlling member includes a sensing member for sensing conditions of the chemical liquid and a controlling member for controlling the negative pressure providing member on the basis of the conditions of the chemical liquid sensed by the sensing member.

11. The apparatus for supplying chemical liquid of claim 9, wherein the negative pressure controlling member includes a sensing member for sensing conditions of the chemical liquid and a controlling member for controlling the supplying pump of the chemical liquid supplying member and the circulating pump of the chemical liquid circulating member on the basis of the conditions of the chemical liquid sensed by the sensing member.

12. The apparatus for supplying chemical liquid of claim 10, wherein the sensing member includes a first pressure sensor for sensing a first pressure of the chemical liquid flowing in the supplying line, a second pressure sensor for sensing a second pressure of the chemical liquid flowing in the circulating line, and a flow sensor for sensing a flow rate of the chemical liquid flowing in the circulating line, and wherein the controlling member for controlling the negative pressure providing member or the supplying pump and the circulating pump on the basis of the first pressure, the second pressure and flow rate transmitted from the sensing member.

13. The apparatus for supplying chemical liquid of claim 1, further comprising a damping member for absorbing a vibration which can be generated in the reservoir by a flow of the chemical liquid in the reservoir.

14. The apparatus for supplying chemical liquid of claim 1, further comprising a buffer reservoir for temporarily storing the chemical liquid supplied to the reservoir.

15. An apparatus for supplying chemical liquid comprising:
a chemical liquid discharging member for discharging a chemical liquid onto a substrate;
a reservoir for storing the chemical liquid being supplied to the chemical liquid discharging member;
a buffer reservoir for temporarily storing the chemical liquid supplied to the reservoir; and
a bubble removing member disposed in the reservoir to remove bubbles which can be generated in the chemical liquid flows to a second portion of the reservoir from a first portion of the reservoir,
wherein the chemical liquid discharging member is connected to the first portion of the reservoir and the buffer reservoir is connected to the second portion of the reservoir.

16. The apparatus for supplying chemical liquid of claim 15, wherein the bubble removing member includes at least one plate having a plurality of holes and the at least one plate divides a space of the reservoir into a plurality of sections in a direction perpendicular to a direction in which the chemical liquid flows in the reservoir.

17. The apparatus for supplying chemical liquid of claim 16, wherein the at least one plate includes a hydrophobic material.

18. The apparatus for supplying chemical liquid of claim 16, wherein each of the holes has a diameter of about 300 μm to about 500 μm.

19. An apparatus for supplying chemical liquid comprising:
a chemical liquid discharging member for discharging a chemical liquid onto a substrate;
a reservoir for storing the chemical liquid being supplied to the chemical liquid discharging member;
a chemical liquid supplying member for supplying the chemical liquid stored in the reservoir;
a chemical liquid circulating member for circulating the chemical liquid from the chemical liquid discharging member to the reservoir; and
a bubble removing member disposed in the reservoir to remove bubbles which can be generated in the chemical liquid.

20. An apparatus for supplying chemical liquid comprising:
a chemical liquid discharging member for discharging a chemical liquid onto a substrate;
a reservoir for storing the chemical liquid being supplied to the chemical liquid discharging member;
a chemical liquid supplying member for supplying the chemical liquid stored in the reservoir;
a chemical liquid circulating member for circulating the chemical liquid from the chemical liquid discharging member to the reservoir; and
a damping member for absorbing a vibration which can be generated in the reservoir by a flow of the chemical liquid in the reservoir.

* * * * *